United States Patent
Miller et al.

(10) Patent No.: US 9,504,141 B2
(45) Date of Patent: Nov. 22, 2016

(54) DIELECTRIC BARRIERS WITH MECHANICAL ATTACHMENT

(71) Applicant: ABL IP Holding LLC, Conyers, GA (US)

(72) Inventors: Troy Thomas Miller, Cumming, GA (US); Chukwunonso Nzubechukwu Okoli, Decatur, GA (US)

(73) Assignee: ABL IP Holding LLC, Decatur, GA (US)

(*) Notice: Subject to any disclaimer, the term of this patent is extended or adjusted under 35 U.S.C. 154(b) by 0 days.

(21) Appl. No.: 14/820,020

(22) Filed: Aug. 6, 2015

(65) Prior Publication Data

US 2016/0044836 A1    Feb. 11, 2016

Related U.S. Application Data

(60) Provisional application No. 62/034,400, filed on Aug. 7, 2014.

(51) Int. Cl.
| | |
|---|---|
| H05K 1/14 | (2006.01) |
| H05K 1/02 | (2006.01) |
| H05K 1/18 | (2006.01) |
| H05K 7/14 | (2006.01) |
| H02G 3/04 | (2006.01) |

(52) U.S. Cl.
CPC .......... H05K 1/0256 (2013.01); H02G 3/0437 (2013.01); H05K 1/183 (2013.01); H05K 7/1471 (2013.01); H02G 3/0406 (2013.01)

(58) Field of Classification Search
CPC ................ H05K 2201/10446; H05K 5/0221; H05K 9/0007; H05K 7/1488; H05K 7/14; H05K 9/0045; H05K 7/02; H05K 7/04; H01L 31/05; B65D 73/00; B23Q 3/02
USPC .................. 361/728–732, 740; 257/E23.001, 257/E23.002, E21.04
See application file for complete search history.

(56) References Cited

U.S. PATENT DOCUMENTS

| | | | | |
|---|---|---|---|---|
| 2,894,241 | A * | 7/1959 | McKee | H05K 3/366 248/222.51 |
| 4,478,331 | A * | 10/1984 | Ruin | B65D 25/107 206/454 |
| 6,399,893 | B1 * | 6/2002 | Terashima | H05K 3/3405 174/255 |
| 7,375,951 | B2 | 5/2008 | Hash | |
| 7,716,821 | B2 * | 5/2010 | Yan | H05K 3/366 228/180.22 |
| 7,864,544 | B2 * | 1/2011 | Smith | H05K 3/366 361/770 |
| 8,582,315 | B2 * | 11/2013 | Nishiyama | H01R 13/6315 361/807 |

(Continued)

Primary Examiner — Hung S Bui
(74) Attorney, Agent, or Firm — Kilpatrick Townsend & Stockton, LLP

(57) ABSTRACT

Described is an electronics assembly that includes an electronics carrier comprising a cavity and a plurality of modules disposed within the electronics carrier. Each module may include a power handling component mounted on a printed circuit board and a dielectric barrier mechanically attached to the printed circuit board to electrically isolate the power handling component of the module from an adjacent module disposed within the electronics carrier. The dielectric barrier may mechanically attach to the electronics carrier.

18 Claims, 8 Drawing Sheets

(56) References Cited

U.S. PATENT DOCUMENTS

2015/0041464 A1* 2/2015 Van Der Linde ...... B25H 3/023
                                                    220/23.88

* cited by examiner

DIELECTRIC BARRIERS WITH MECHANICAL ATTACHMENT

CROSS REFERENCE TO RELATED APPLICATIONS

This application claims the benefit of U.S. Provisional Application Ser. No. 62/034,400 ("the '400 application"), filed on Aug. 7, 2014, entitled DIELECTRIC BARRIERS FOR ELECTRICALLY ISOLATING HIGH VOLTAGE COMPONENTS. The '400 application is hereby incorporated in its entirety by this reference.

FIELD OF THE INVENTION

The field of the invention relates to dielectric barriers that couple with power handling components, such as printed circuit boards (PCBs) populated with any of a variety of electronic components (such as but not limited to relay modules, dimmers, etc.) to electrically isolate adjacent power handling components and thereby prevent arc flash between adjacent power handling components.

BACKGROUND

The use of dielectric barriers to separate adjacent power handling components (such as, for example, those positioned within an electronics carrier) is not new. A dielectric barrier can be provided on each such power handling component, such as with chemical adhesives that glue the barrier onto the component. Gluing the dielectric barriers to the components results in increased manufacturing cost (e.g., the cost of the glue) and time (e.g., by virtue of the dry time). Moreover, the heat generated by the components can affect the glue and detrimentally impact the adhesive's ability to adhere the barrier to the power handling component and thus jeopardize the required isolation between the power handling components.

SUMMARY

The terms "invention," "the invention," "this invention" and "the present invention" used in this patent are intended to refer broadly to all of the subject matter of this patent and the patent claims below. Statements containing these terms should be understood not to limit the subject matter described herein or to limit the meaning or scope of the patent claims below. Embodiments of the invention covered by this patent are defined by the claims below, not this summary. This summary is a high-level overview of various aspects of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings and each claim.

According to certain embodiments of the present invention, an electronics assembly includes an electronics carrier comprising a cavity and a plurality of modules disposed within the electronics carrier. Each module may include a power handling component mounted on a printed circuit board and a dielectric barrier mechanically attached to the printed circuit board to electrically isolate the power handling component of the module from an adjacent module disposed within the electronics carrier. The dielectric barrier may mechanically attach to the electronics carrier.

According to certain embodiments of the present invention, a method for assembling an electronics assembly includes providing an electronics carrier having a cavity, a first lower protrusion extending from a first side of the electronics carrier, a first upper protrusion extending from the first side of the electronics carrier, a second lower protrusion extending from a second side of the electronics carrier, and a second upper protrusion extending from the second side of the electronics carrier; providing at least one module disposed inside the electronics carrier, wherein each module comprises a power handling component mounted on a printed circuit board with a dielectric barrier to electrically isolate the power handling component from adjacent objects, the dielectric barrier comprising a first tab extending from a first side of the dielectric barrier and a second tab extending from a second side of the dielectric barrier; inserting the at least one module into the electronics carrier such that the first tab interfaces with the first lower protrusion; and rotating the dielectric barrier about the first tab such that the second tab clears an upper edge of the second side of the electronics carrier and the second tab interfaces with at least one of the second lower protrusion and the second upper protrusion.

DETAILED DESCRIPTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Figure 1:
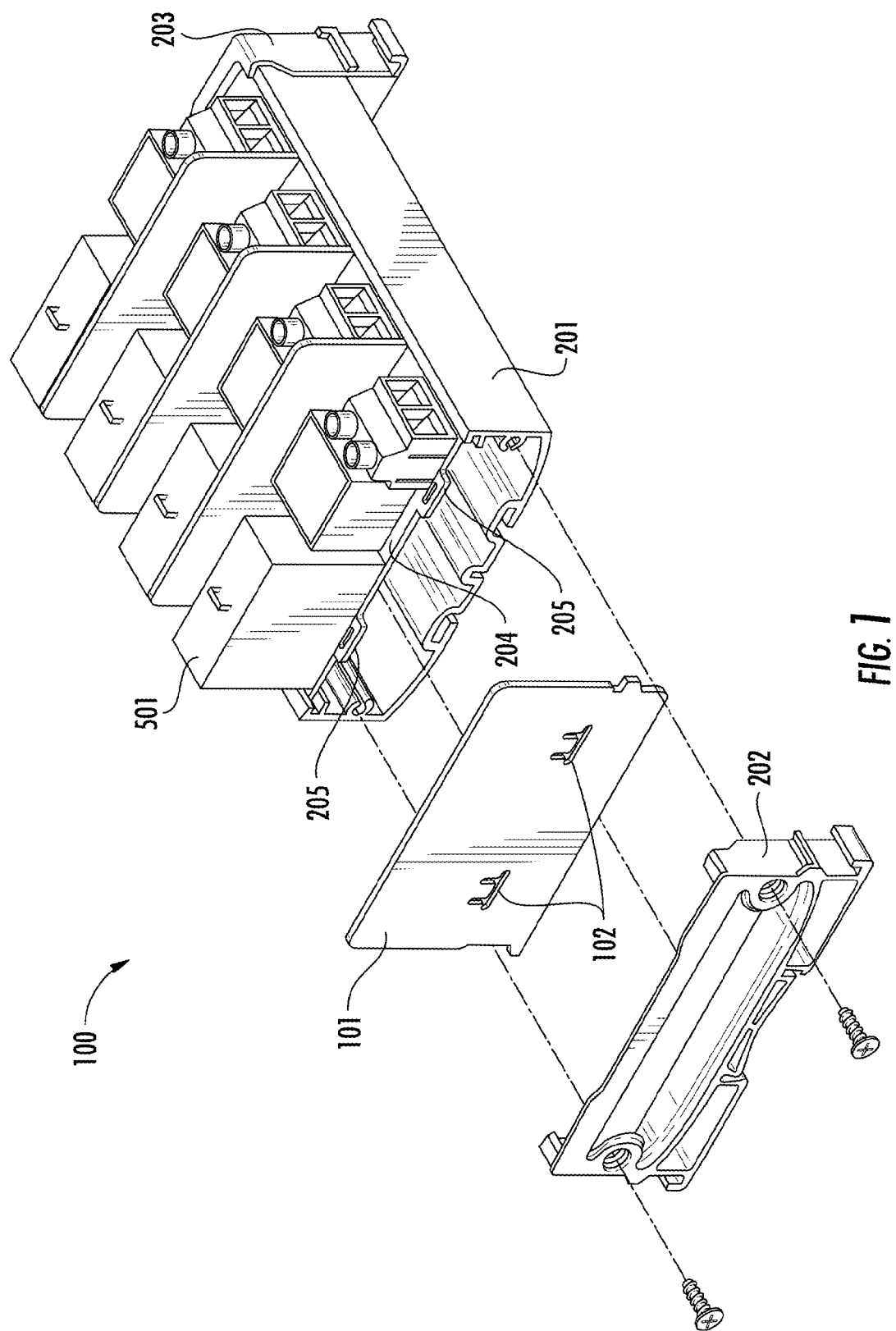
FIG. 1 is a perspective exploded view of an electronics assembly having a dielectric barrier and a power handling component, according to certain embodiments of the present invention.

FIGS. 1-7 illustrate embodiments of dielectric barriers 101 used in an electronics assembly 100. In these embodiments, the electronics assembly 100 may include an electronics carrier 201, a first electronics carrier end plate 202, a second electronics carrier end plate 203, and one or more power handling components 501 separated by dielectric barriers 101. As shown in FIGS. 1, 5A, and 5B, each power handling component 501 may be secured to a PCB 204 where the PCB 204 may include one or more slotted tabs 205 on one or more lateral edge. Further, the electronics carrier 201 may form a channel shaped to receive modules 150 (see FIG. 6A), as discussed below.

Figure 2:
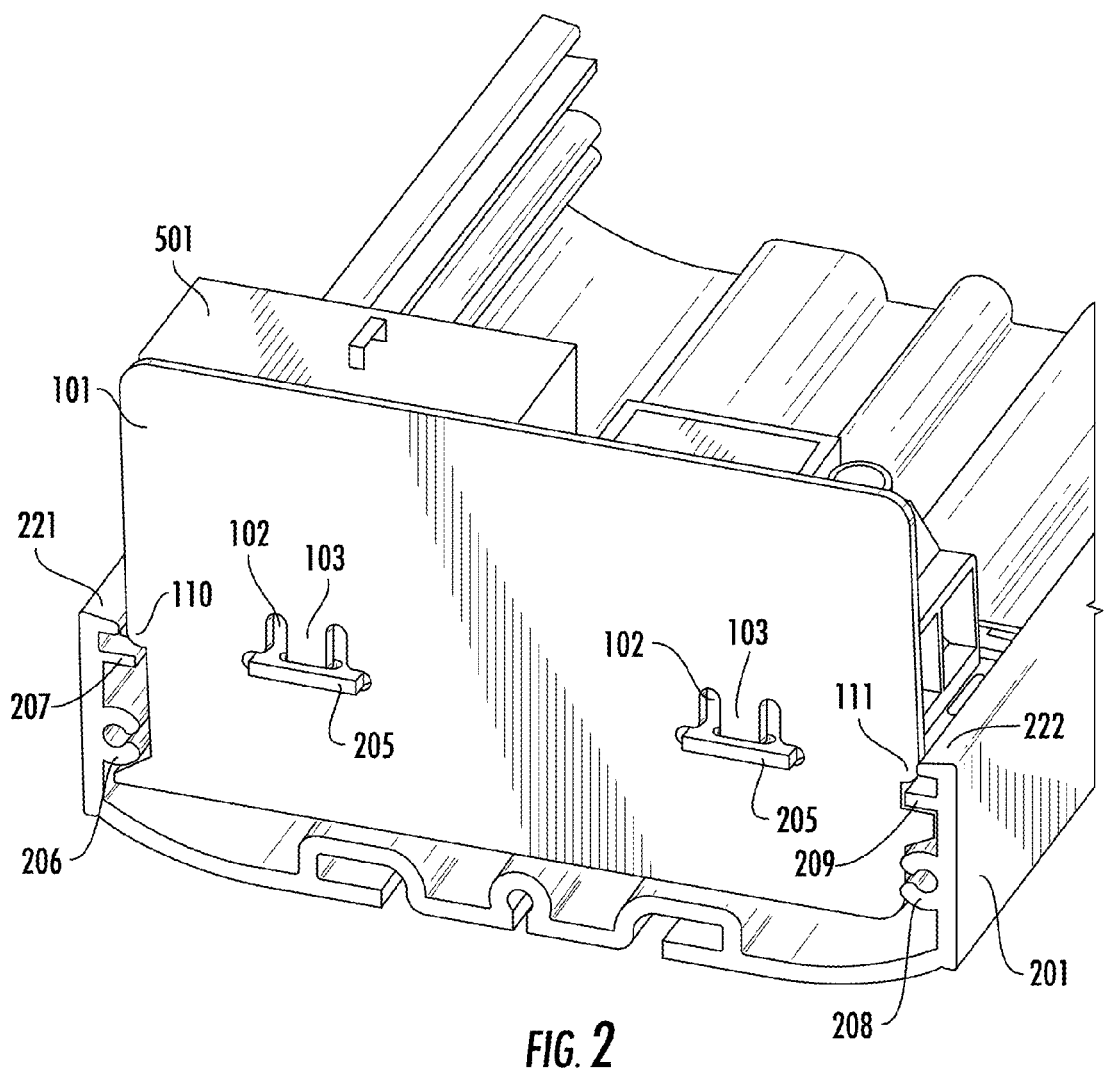
FIG. 2 is a perspective view of the dielectric barrier of FIG. 1 attached to a power handling component and positioned within an electronics carrier.
Figure 3A:
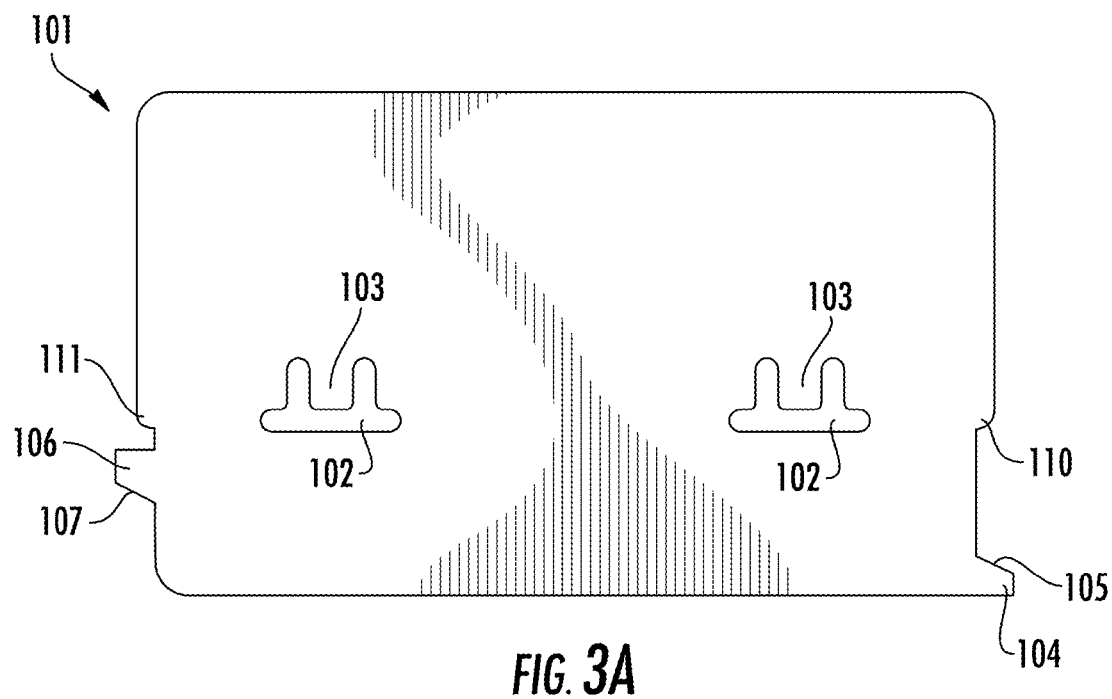
FIG. 3A is a rear elevation view of the dielectric barrier of FIG. 1.
Figure 3B:
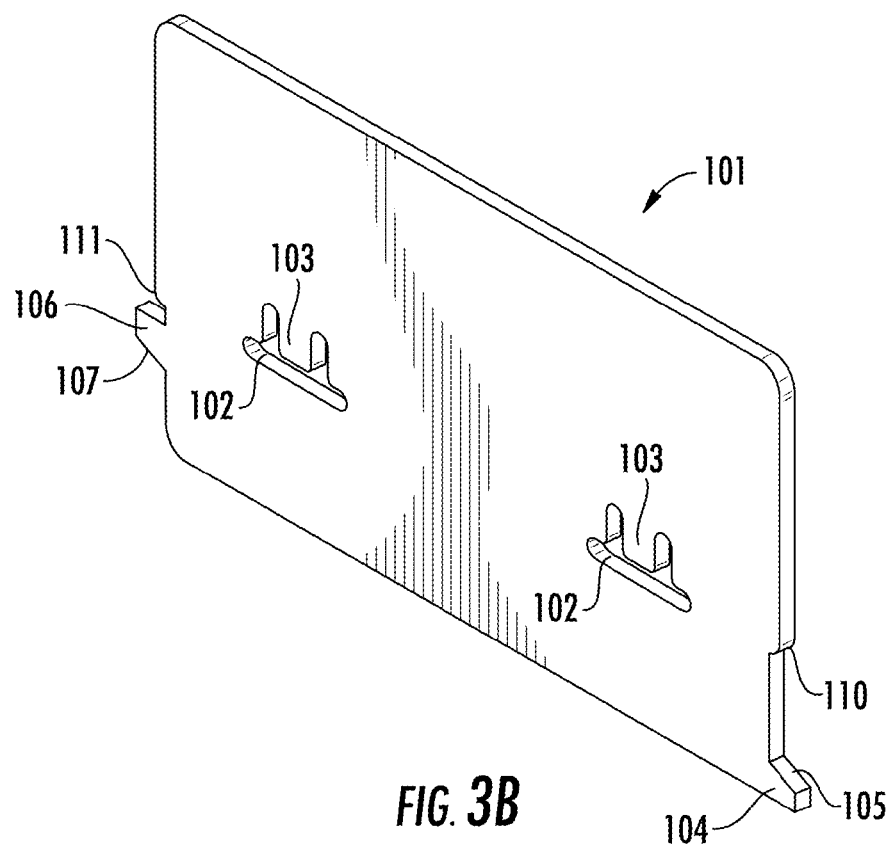
FIG. 3B is a perspective view of the dielectric barrier of FIG. 3A.

Embodiments of the present invention provide a dielectric barrier 101 that is approximately rectangular and can mechanically snap onto a power handling component 501 and thereby improve the integrity of the connection between the two. More specifically, as shown in FIGS. 2-3B, the dielectric barrier 101 may include apertures 102 that receive the slotted tabs 205 that extend from a side edge of the PCB 204. In the illustrated embodiment, the dielectric barrier 101 includes two apertures 102 and the PCB 204 includes two tabs 205 that engage the apertures 102. However, one of skill would readily understand that fewer or more apertures/tabs could be provided on the barrier/PCB, respectively.

The apertures 102 in the illustrated barrier 101 have an inverted pi (π) shape such that a downwardly-extending tongue 103 extends proximate the aperture 102. To couple a dielectric barrier 101 onto a power handling component 501, the tabs 205 of the PCB 204 are received in the apertures 102 of the barrier 101 until the downwardly-extending tongues 103 of the apertures 102 engage the slots 210 in the slotted tabs 205 to thereby snap-fit and lock the two components together in a locked configuration. Obviously other aperture/tab geometries are contemplated assuming they complement each other to ensure a locking relationship between the dielectric barrier 101 and power handling component 501.

Figure 8:
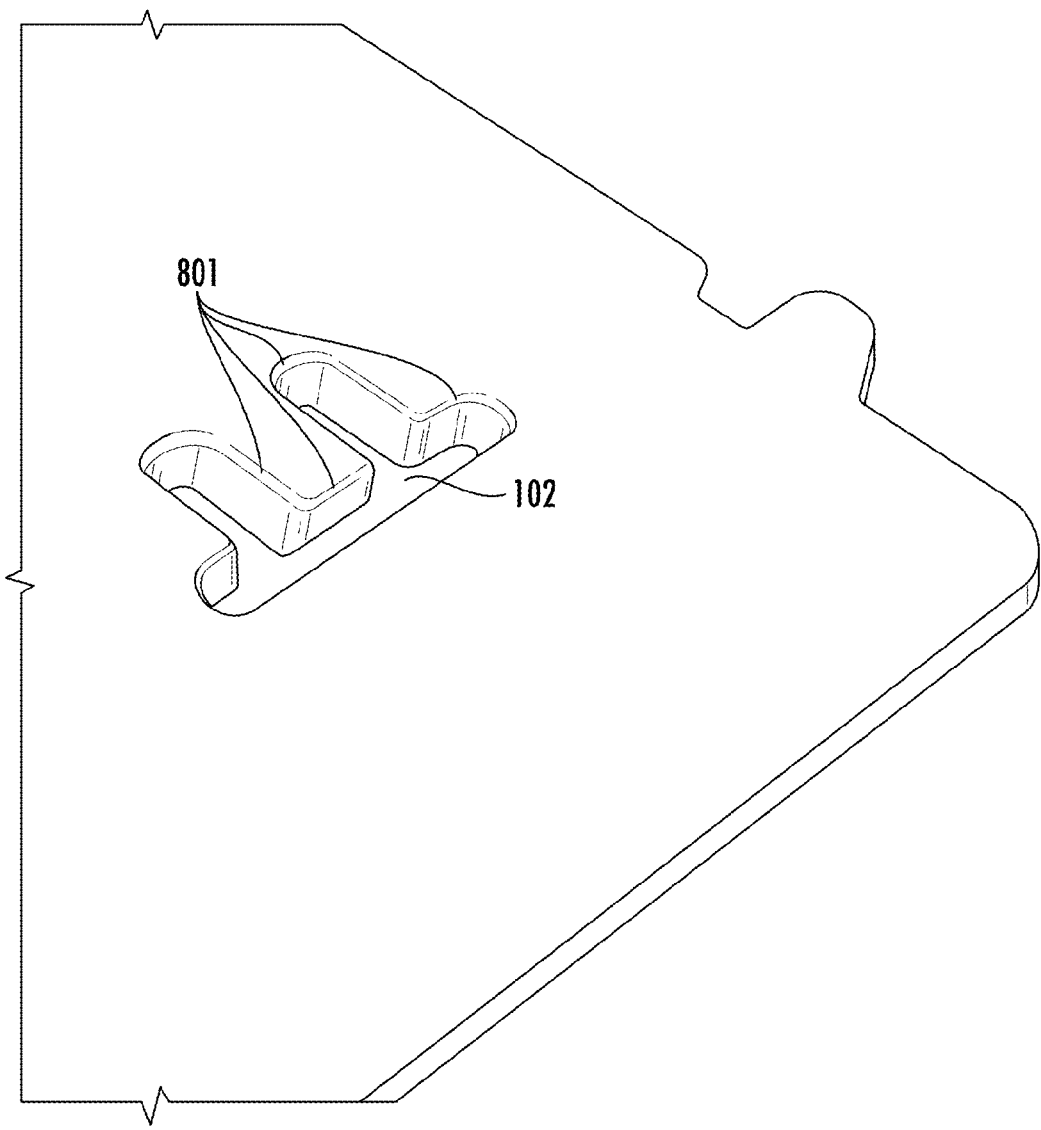
FIG. 8 is a detail perspective view of the dielectric barrier of FIG. 1.

In some embodiments, as shown in FIG. 8, the apertures 102 may include a chamfer 801 along some or all of the edges of each aperture 102, including the edges of downwardly-extending tongue 103. The chamfer 801 facilitates efficient interfaces with adjacent parts and minimizes binding and uneven interaction with the adjacent components. For example, chamfer 801 ensures efficient interfaces with the slotted tabs 205 and the associated slots 210.

The dielectric barrier 101 may be formed from any dielectric material. In some embodiments, the material for the dielectric barrier 101 is a high dielectric, flame retardant material. One suitable source for dielectric materials is ITW Formex®. The barrier shape may be formed from such materials in a variety of ways, including, but not limited to, injection-molding, laser-cutting, etc. In one embodiment, however, the dielectric barrier 101 is die-stamped into the desired shape. The stamping action results in the barrier material around the periphery of the apertures to thin slightly on the side of the barrier facing the die-stamp. Snap-fit connection between the barrier 101 and power handling component 501 may be facilitated by inserting the PCB tabs 205 into that side of the barrier 101 with such thinner edges. The dielectric barrier 101 may be between 0.04" and 0.125" thick. In some embodiments, the dielectric barrier 101 may be approximately 0.062" thick.

In some embodiments, after the barriers 101 are snapped onto the power handling components 501 to form modules 150 (see FIG. 6A), the modules 150 are assembled in an electronics carrier 201. While the modules 150 are discussed and illustrated herein for assembly in an electronics carrier 201, one of skill in the art will readily understand that the modules 150 may be installed or otherwise used in other PCB mounting systems (either via the installation methods disclosed below or via other installation methods).

Each module 150 may be slid into an open end of the electronics carrier 201 and along its length, after which one or both of the end caps 202, 203 may be attached to the electronics carrier 201, such as by screws inserted into screw apertures 206, 208 within the electronics carrier 201. Electronics carriers 201 are typically mounted on a rail end-to-end (e.g., a DIN carrier may be mounted on a DIN rail). Thus, it is very difficult to remove an electronics carrier end cap 202, 203 and slide modules 150 in and out of the electronics carrier 201 given the proximity of an adjacent electronics carrier on the rail.

Snap-fit engagement of the modules 150 downwardly into the electronics carrier 201 may be desirable to simplify removal and replacement of the modules 150 within the electronics carrier 201. In some such embodiments, as shown in FIGS. 3A and 3B, a tab extends outwardly from each side of the dielectric barrier 101. The tabs are laterally offset so that a first tab 104 extends outwardly more proximate the bottom of the barrier 101 than the second tab 106.

Figure 4:
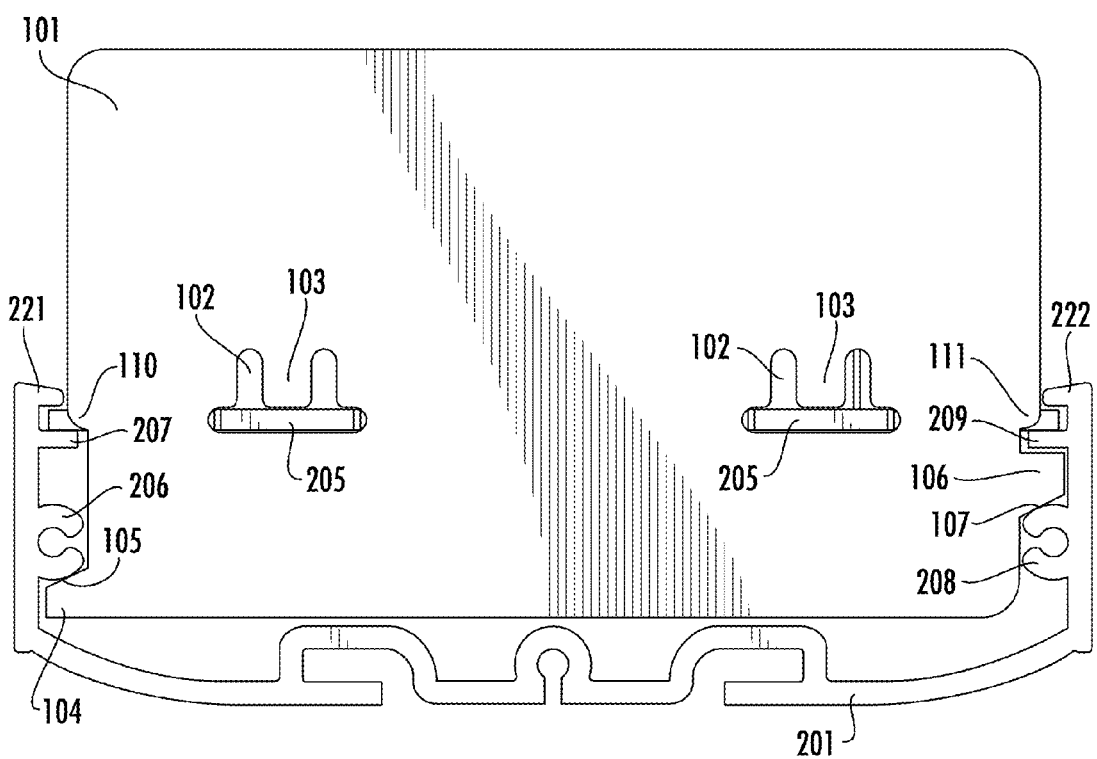
FIG. 4 is a front elevation view of the dielectric barrier of FIG. 1 attached to a power handling component and positioned within an electronics carrier.
Figure 5A:
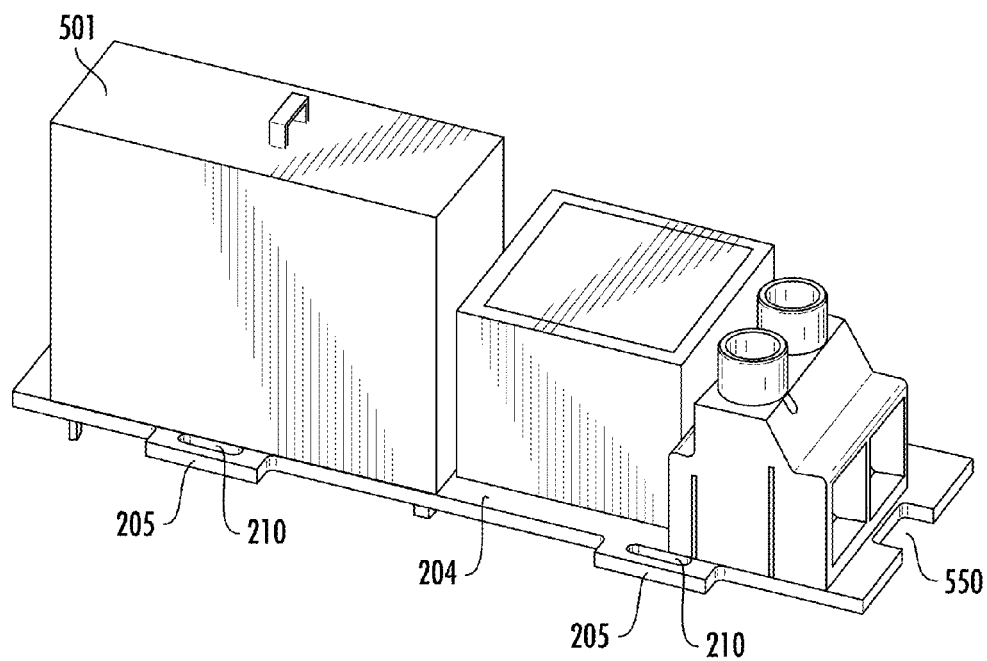
FIG. 5A is a perspective view of the power handling component of FIG. 1.
Figure 5B:
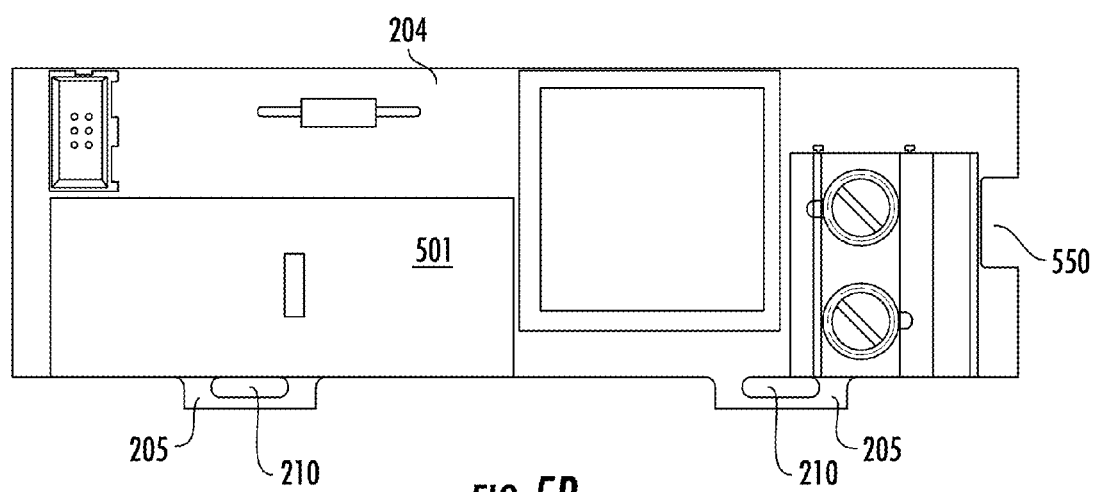
FIG. 5B is a top plan view of the power handling component of FIG. 1.
Figure 6A:
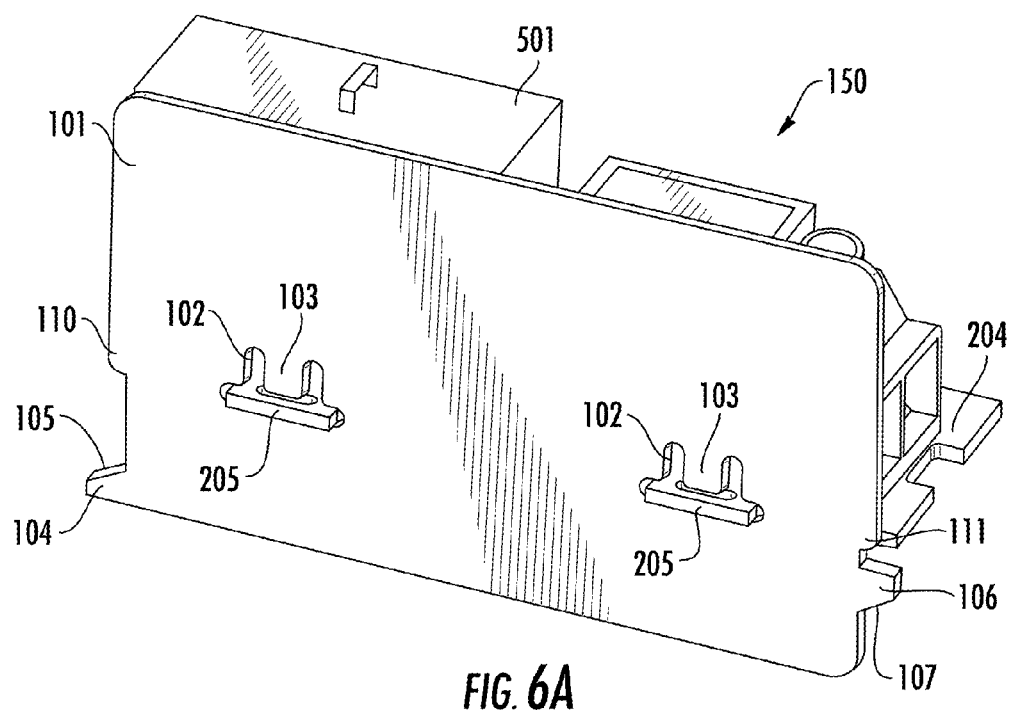
FIG. 6A is a perspective view of the dielectric barrier of FIG. 1 attached to the power handling component of FIG. 5A.
Figure 6B:
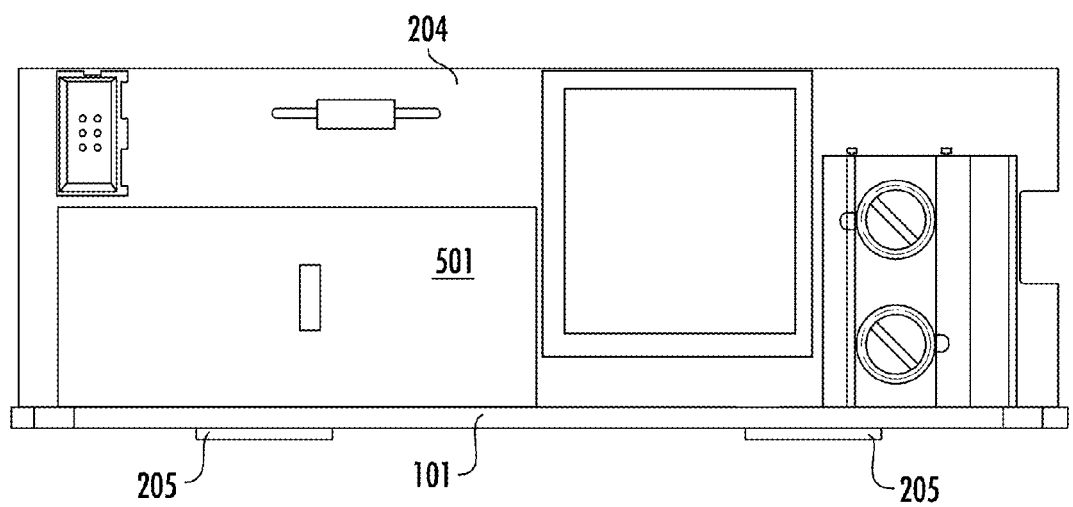
FIG. 6B is a top plan view of the dielectric barrier of FIG. 1 attached to a power handling component of FIG. 5A.
Figure 7:
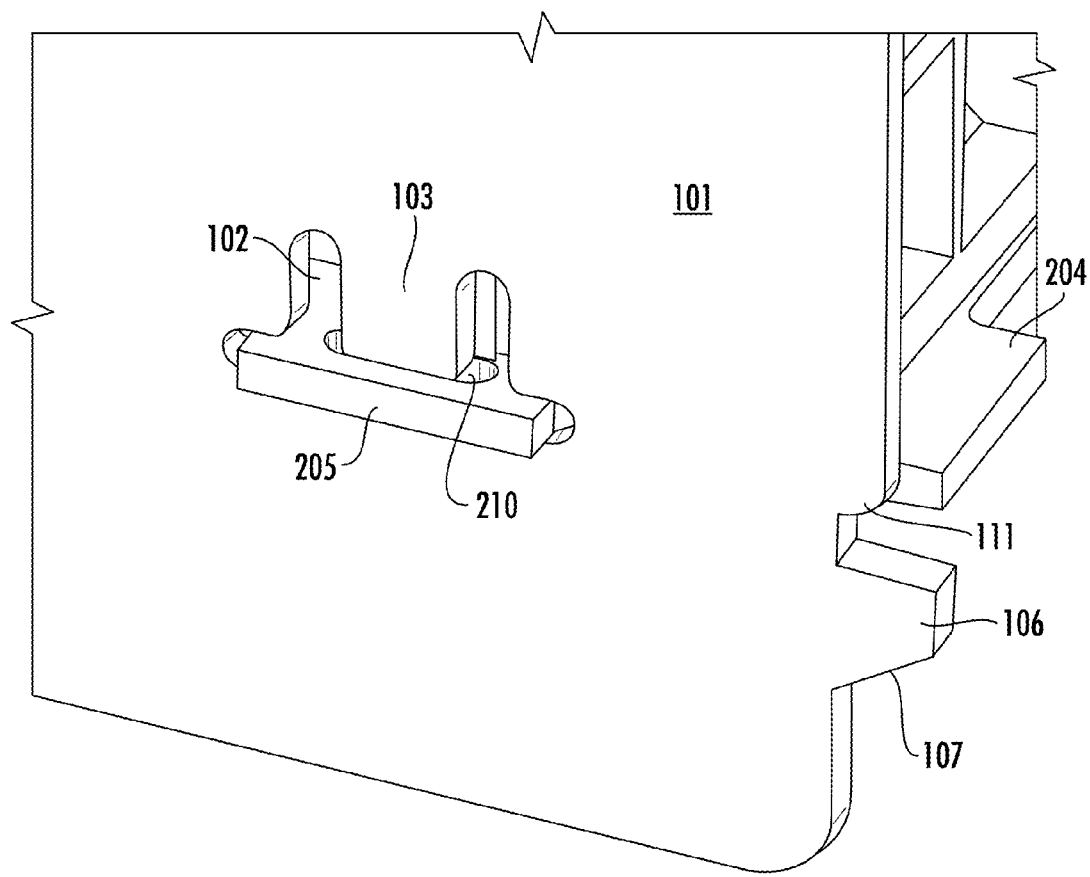
FIG. 7 is a detail perspective view of the dielectric barrier of FIG. 1 attached to the power handling component of FIG. 5A.

As shown in FIG. 4, in some embodiments, to lock the module 150 in the electronics carrier 201, the module 150 is angled so that the first tab 104 can be positioned under a first protrusion within the inner wall of the electronics carrier 201. In the illustrated embodiment, the first protrusion is part of screw aperture 206 (referred to as first protrusion 206 as well) that extends along the length of the electronics carrier 201. However, a separate first protrusion may also be provided. In some embodiments, a ramped surface 105 is provided on the first tab 104 to facilitate positioning under first protrusion 206. The ramped surface 105 may be curved or may be flat/planer. In embodiments where ramped surface 105 is flat, it may be between 100° and 150° with respect to the vertical edges of the dielectric barrier 101. In some embodiments, the ramped surface 105 may be approximately 115° (±2°) with respect to the vertical edges of the dielectric barrier 101. Once the first tab 104 is positioned under first protrusion 206, the module 150 can then be rotated and pushed downwardly until the second tab 106 clears the second upper lip 222 of the electronics carrier 201 and snaps into a position between a second lower protrusion (in the illustrated embodiment screw aperture 208) and a second upper protrusion 209 located on the inner wall of the electronics carrier 201. The second tab 106 may also include a ramped surface 107 to facilitate its movement past the second upper lip 222 and the second upper protrusion 209 of the electronics carrier 201. In some embodiments, the upper portion of the electronics carrier 201 may deflect slightly due to the force imparted by ramped surface 107 to allow the second tab 106 to fully seat. For example, the portion of electronics carrier 201 attached to second upper protrusion 209 may deflect away from the barrier 101 until the second tab 106 is below the second upper protrusion 209. The ramped surface 107 may be curved or may be flat/planer. In embodiments where ramped surface 107 is flat, it may be between 100° and 150° with respect to the vertical edges of the dielectric barrier 101. In some embodiments, the ramped surface 107 may be approximately 119° (±2°) with respect to the vertical edges of the dielectric barrier 101.

In addition to the snap-fit interface described above, the module 150 and electronics carrier 201 may be configured to include other interface types such as a press fit interface (tab and a slot), a wavy or jagged edge top, or a different shaped tab (e.g., where ramped surface 105 and ramped surface 107 are curved).

When the module 150 is in the locked configuration with respect to the electronics carrier 201, the PCB 204 rests on the upper surfaces of the upper protrusions 207 and 209.

In some embodiments, as shown in FIG. 4, the arrangement between the dielectric barrier 101 and the electronics carrier 201 is reversible. The first tab 104 may be inserted under the second lower protrusion 208 and the second tab 106 clears the first upper lip 221 of the electronics carrier 201 and snaps into a position between the first lower protrusion 206 and the first upper protrusion 207 located on the inner wall of the electronics carrier. However, in some embodiments, the dielectric barrier 101 and the electronics carrier 201 may be configured such that the arrangement is not reversible.

The dielectric barrier 101 may also include a first shoulder 110 and a second shoulder 111. The shoulders 110 and 111 may interface with the upper protrusions 207 and 209 and may be directly adjacent to upper lips 221 and 222. As shown in FIG. 4, shoulder 110 may interface with first upper protrusion 207 and be located adjacent to upper lip 221. Similarly, shoulder 111 may interface with second upper protrusion 209 and be located adjacent to upper lip 222. The lips 221, 222 may function as lateral location fittings to ensure the barrier 101 is located appropriately in the lateral direction with respect to electronics carrier 201. The interfaces between shoulders 110, 111 and upper protrusions 207, 209, respectively, may impart a slight vertical tension into the barrier 101 to vertically secure the barrier 101 with respect to the electronics carrier 201. For example, the offset distance between the surface of shoulder 110 and ramped surface 105 may be dimensioned to ensure a tight fit between ramped surface 105 and first lower protrusion 206 to create a slight deformation of protrusion 206 and/or bias (based on the geometry of ramped surface 105) toward the opposite side of the electronics carrier 201. Any bias toward the opposite side of the electronics carrier 201 may be counteracted by (1) a similar bias based on the interface between the ramped surface 107 and second lower protrusion 208 and/or (2) the interface between lip 222 and barrier 101.

It is notable that, in the illustrated barrier embodiment, the barrier 101 extends below the bottom of its associated power handling component 501 more than halfway into a depth of the cavity of the electronics carrier. In some embodiments, the lower portion of the barrier 101 extends almost (if not entirely) to the bottom of the cavity of the electronics carrier 201. This creates an almost complete barrier between adjacent power handling components to protect against arc flash.

Snap-fit engagement of the modules 150 into the electronics carrier 201 simplifies removal and replacement of the modules 150 within the electronics carrier 201. To remove a module 150, a screwdriver or other lever device is positioned under a recess 550 provided on the PCB 204 and pivoted to lift the module 150 upwardly from the electronics carrier 201 by disengagement first of the second tab 106 and then of the first tab 104 on the dielectric barrier 101 from the electronics carrier 201 (i.e., the opposite order as when the module is installed). A new or serviced module can then be installed in the electronics carrier 201 as described above.

The electronics carrier 201 shown in the Figures is solely for purposes of illustration, and embodiments of the modules 150 disclosed herein are not limited to use only with electronics carriers, much less only the illustrated electronics carriers. By way of example, the protrusions, grooves, wireways, etc. may have different geometries and/or may be located differently on different electronics carriers. The dielectric barrier may easily be modified to render it compatible with the inner geometry of various electronics carriers. Moreover, as discussed above, the modules 150 disclosed herein may also be installed or otherwise used in PCB mounting systems other than electronics carriers 201.

Different arrangements of the components depicted in the drawings or described above, as well as components and steps not shown or described are possible. Similarly, some features and sub-combinations are useful and may be employed without reference to other features and sub-combinations. Embodiments of the invention have been described for illustrative and not restrictive purposes, and alternative embodiments will become apparent to readers of this patent. Accordingly, the present invention is not limited to the embodiments described above or depicted in the drawings, and various embodiments and modifications may be made without departing from the scope of the claims below.

That which is claimed is:

1. An electronics assembly, comprising:
an electronics carrier comprising a cavity; and
a plurality of modules disposed within the electronics carrier, wherein each module comprises:
   i. a power handling component mounted on a printed circuit board, wherein the printed circuit board comprises at least one tab; and
   ii. a dielectric barrier mechanically attached to the printed circuit board to electrically isolate the power handling component of the module from an adjacent module disposed within the electronics carrier, wherein the dielectric barrier mechanically attaches to the electronics carrier, wherein the dielectric barrier comprises at least one aperture; and the at least one tab is configured to be inserted into the at least one aperture so as to snap-fit the dielectric barrier onto the printed circuit board.

2. The electronics assembly of claim 1, wherein:
the at least one tab comprises a slot;
the dielectric barrier further comprises a tongue configured to engage the slot in the at least one tab when the dielectric barrier is snap-fitted onto the printed circuit board.

3. The electronics assembly of claim 1, wherein the at least one aperture comprises an inverted pi (Π) shape.

4. The electronics assembly of claim 1, wherein the dielectric barrier mechanically attaches to the electronics carrier via a snap-fit connection.

5. The electronics assembly of claim 1, wherein:
the dielectric barrier comprises at least one tab; and
the electronics carrier comprises at least one protrusion extending within the cavity and along the electronics carrier.

6. The electronics assembly of claim 5, wherein:
the at least one tab comprises a first tab extending from a first side of the dielectric barrier and a second tab extending from a second side of the dielectric barrier;
the at least one protrusion extending within the cavity and along the electronics carrier comprises a first protrusion and a second protrusion, wherein the first and second tabs engage the first and second protrusions, respectively, to mechanically attach the dielectric barrier to the electronics carrier via a snap-fit connection.

7. The electronics assembly of claim 6, wherein:
the first tab extends proximate a bottom edge of the dielectric barrier and the second tab is more offset from the bottom edge of the dielectric barrier.

8. The electronics assembly of claim 6, wherein:
the first and second tabs each comprise ramped surfaces that are obliquely oriented with respect to side edges of the dielectric barrier.

9. The electronics assembly of claim 5, wherein:
the at least one tab comprises a first tab extending from a first side of the dielectric barrier and a second tab extending from a second side of the dielectric barrier;
the at least one protrusion comprises:
  a first lower protrusion extending from a first side of the electronics carrier;
  a first upper protrusion extending from the first side of the electronics carrier;
  a second lower protrusion extending from a second side of the electronics carrier; and
  a second upper protrusion extending from the second side of the electronics carrier;
the first tab is inserted under the first lower protrusion adjacent to the bottom of the electronics carrier; and
the second tab is inserted under the second upper protrusion and above the second lower protrusion.

10. The electronics assembly of claim 9, wherein the printed circuit board rests on an upper surface of at least one of the first upper protrusion and the second upper protrusion.

11. The electronics assembly of claim 1, wherein, in a locked configuration, the dielectric barrier extends more than halfway into a depth of the cavity of the electronics carrier to create a barrier between adjacent components.

12. A module to be inserted into a cavity of an electronics carrier, comprising:
a power handling component mounted on a printed circuit board, wherein the printed circuit board comprises at least one tab; and
a dielectric barrier mechanically attached to the printed circuit board to electrically isolate the power handling component of the module from an adjacent module disposed within the electronics carrier, wherein:
  the dielectric barrier mechanically attaches to the electronics carrier; and
  the dielectric barrier comprises at least one aperture, wherein the at least one tab is configured to be inserted into the at least one aperture so as to snap-fit the dielectric barrier onto the printed circuit board.

13. The module of claim 12, wherein the at least one aperture comprises an inverted pi (Π) shape.

14. The module of claim 12, wherein the dielectric barrier comprises a first tab extending proximate a bottom edge of the dielectric barrier and a second tab that is more offset from the bottom edge of the dielectric barrier.

15. The dielectric barrier of claim 14, further comprising a first shoulder extending from a first side of the dielectric barrier disposed above the first tab and a second shoulder extending from a second side of the dielectric barrier disposed above the second tab.

16. A method for assembling an electronics assembly, the method comprising:
providing an electronics carrier having a cavity, a first lower protrusion extending from a first side of the electronics carrier, a first upper protrusion extending from the first side of the electronics carrier, a second lower protrusion extending from a second side of the electronics carrier, and a second upper protrusion extending from the second side of the electronics carrier;
providing at least one module disposed inside the electronics carrier, wherein each module comprises a power handling component mounted on a printed circuit board with a dielectric barrier to electrically isolate the power handling component from adjacent objects, the dielectric barrier comprising a first tab extending from a first side of the dielectric barrier and a second tab extending from a second side of the dielectric barrier;
inserting the at least one module into the electronics carrier such that the first tab interfaces with the first lower protrusion; and
rotating the dielectric barrier about the first tab such that the second tab clears an upper edge of the second side of the electronics carrier and the second tab interfaces with at least one of the second lower protrusion and the second upper protrusion.

17. The method of claim 16, further comprising:
inserting the first tab under the first lower protrusion; and
inserting the second tab under the second upper protrusion and above the second lower protrusion.

18. The method of claim 16, further comprising:
inserting at least one tab of the printed circuit board into at least one aperture of the dielectric barrier;
forming the at least one aperture with an inverted pi (Π) shape to define a tongue; and
inserting the tongue into a slot in the at least one tab of the printed circuit board.

* * * * *